United States Patent [19]

Schreck et al.

[11] Patent Number: 5,197,029

[45] Date of Patent: Mar. 23, 1993

[54] COMMON-LINE CONNECTION FOR INTEGRATED MEMORY ARRAY

[75] Inventors: John F. Schreck; Phat C. Truong, both of Houston, Tex.

[73] Assignee: Texas Instruments Incorporated, Dallas, Tex.

[21] Appl. No.: 651,817

[22] Filed: Feb. 7, 1991

[51] Int. Cl.$^5$ ............................................. G11C 13/00
[52] U.S. Cl. ............................ 365/189.01; 365/189.05
[58] Field of Search ............... 365/189.01, 185, 189.05

[56] References Cited

U.S. PATENT DOCUMENTS 4,860,255 8/1989 Shimohigashi et al. ........ 365/189.01

Primary Examiner—Terrell W. Fears
Attorney, Agent, or Firm—Theodore D. Lindgren; Leo N. Heiting; Richard L. Donaldson

[57] ABSTRACT

A common connection to reduces the amount of chip area required to perform read and programming functions, particularly where signals such as read, programming, supply voltage and data signals are generated from remote locations on the memory chip. The common connection is made in an integrated circuit having a control circuit, a plurality of memory cell arrays having column lines, a sense amplifier circuit, and a programming circuit including at least first and second parts. At least one column of one memory cell array is selectively connected to a common line/node upon receiving at least a first signal from the control circuit. The first part of the programming circuit is selectively connected to the common line/node upon receiving a second signal from the control circuit. The second part of the programming circuit is connected to the common line/node upon receiving a third signal from the control circuit. The sense amplifier circuit is selectively connected to the common line/node upon receiving a fourth signal from the control circuit. The common line/node may be a conductor extending from a first area of the integrated-circuit memory to a second area of the integrated-circuit memory, the first and second areas including, for example, the first and second parts of the programming circuit respectively located at opposite ends of the integrated-circuit memory. The first part of the programming circuit may provide a high voltage to a source-column line of the integrated-circuit memory. The second part of the programming circuit may provide a reference potential and a supply voltage to the common line/node.

19 Claims, 4 Drawing Sheets

COMMON-LINE CONNECTION FOR INTEGRATED MEMORY ARRAY

BACKGROUND OF THE INVENTION

This invention relates to integrated-circuit memory arrays, including electrically-programmable, read-only-memory (EPROM) arrays, and to a common-line connection for integrated-circuit memories having segmented arrays and distributed circuitry for programming and reading the individual cells of those memories.

In particular, this invention relates to a connection providing a common path for programming logic signals, for programming voltages, for data signal transmission, and for sense amplifier bias voltage in an integrated memory device.

An EPROM array is one example of an integrated circuit in which the circuit and method of this invention may be used. EPROM arrays include floating-gate memory cells arranged in rows and columns. The floating gate of a programmed memory cell is charged with electrons, and the electrons in turn render the source-drain path under the charged floating gate nonconductive when a chosen row-line select voltage is applied to the control gate. The nonconductive state is read as a "zero" bit. The floating gate of a non-programmed cell is neutrally charged such that the source-drain path under the non-programmed floating gate is conductive when the same chosen row-line select voltage is applied to the control gate. The conductive state is read as a "one" bit.

Each column and row of an EPROM array may contain thousands of cells. The sources of each cell in a column are connected to a virtual-ground line (source-column line). The drains of each cell in a column are connected to a separate bitline (drain-column line). The control gates of each cell in a row are connected to a wordline.

Programmable memories commonly have read circuitry and program circuitry joining at a common node and, in some cases, sharing some devices. The term "read circuitry" as used herein refers to components that are implemented to determine the state of a memory cell. The term "program circuitry" as used herein refers to components that program or alter the state of a memory cell. An example of transistors and interconnect components that are used by both read and program circuitry is the decoding circuitry used to select columns in an EPROM.

Prior-art circuitry includes switching transistors that select which column to either program or read in response to a signal from a decoder. In such prior-art circuitry, a program enable input signal determines which block of circuitry, the program circuitry or the read circuitry, is activated. The two circuitry blocks are joined by a common node having the function of either connecting the read circuitry to the column or forcing programming potentials onto the column.

There is a need for reduction in the chip area required to perform read and programming functions, especially where signals for the read and programming circuits are distributed at remote locations on the chip.

SUMMARY OF THE INVENTION

The circuitry of this invention reduces the amount of chip area required to perform read and programming functions by using a common line/node connection. Where signals such as read, programming, supply voltage and data signals are generated from remote locations on the memory chip, the reduction in area requirement is accomplished by using a single line or node to transmit those signals from one part of the chip to another.

The common connection is described in relation to an electrically-programmable, read-only-memory, the memory having a control circuit, a plurality of memory cell arrays having column lines, a sense amplifier circuit, and a programming circuit including at least first and second parts. At least one column of one memory array is selectively connected to a common line/node upon receiving at least a first signal from the control circuit. The first part of the programming circuit is selectively connected to the common line/node upon receiving a second signal from the control circuit. The second part of the programming circuit is connected to the common line/node upon receiving a third signal from the control circuit. The sense amplifier circuit is selectively connected to the common line/node upon receiving a fourth signal from the control circuit. The common line/node may be a conductor extending from a first area of the integrated-circuit memory to a second area of the integrated-circuit memory, the first and second areas including, for example, the first and second parts of the programming circuit respectively located at opposite ends of the integrated-circuit memory. The first part of the programming circuit may provide a high voltage to a source-column line of the integrated-circuit memory. The second part of the programming circuit may provide a reference potential and a supply voltage to the common line/node.

DETAILED DESCRIPTION OF THE SPECIFIC EMBODIMENT

Figure 1:
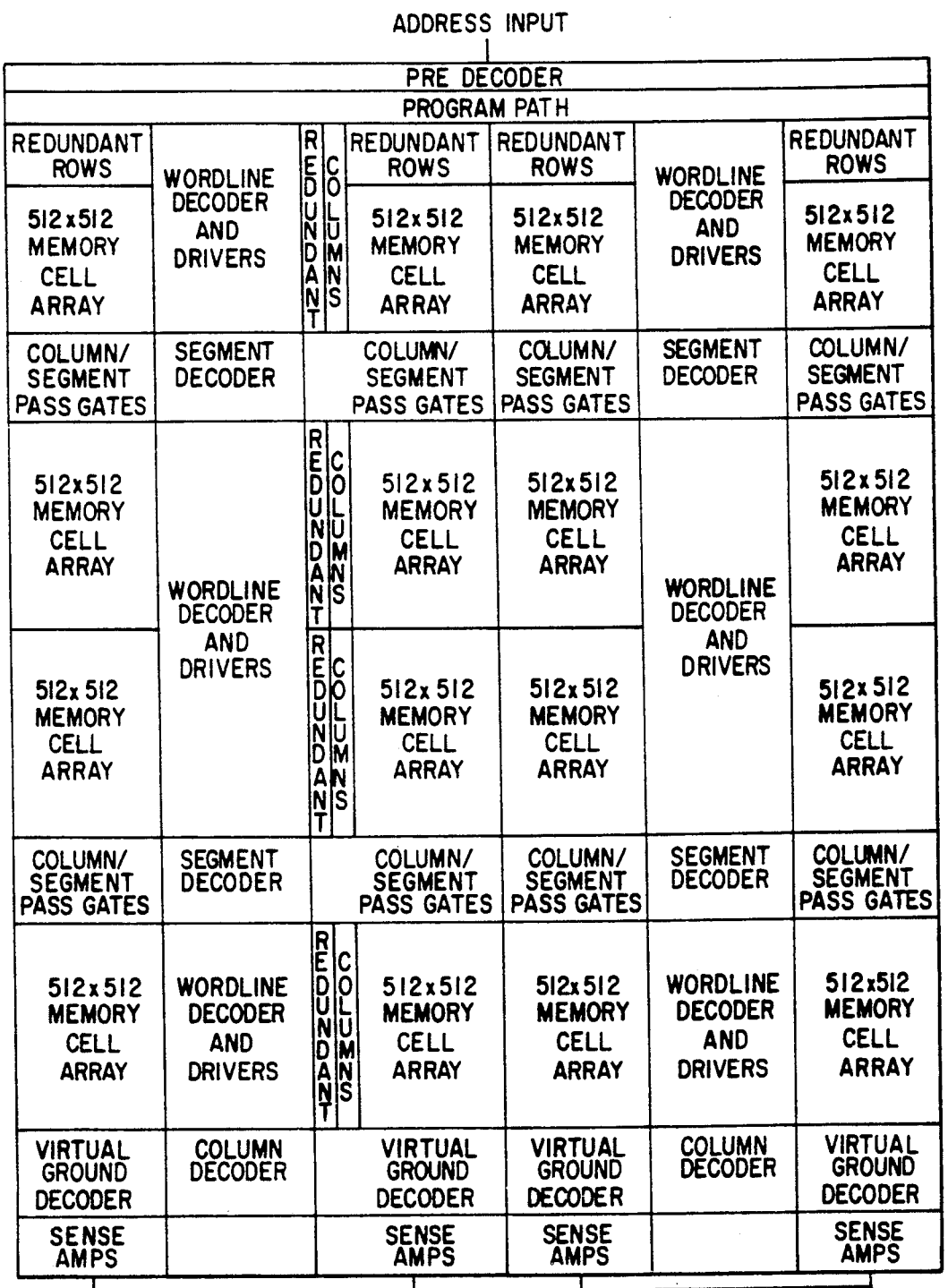
FIG. 1 is a representation of an integrated circuit layout for a four-megabit EPROM array.

Referring to FIG. 1, an example of an integrated circuit layout for a nominal four-megabit EPROM is illustrated. The layout, in which dimensional proportions are not those of actual manufacture, illustrates sixteen 512×512 memory sub-arrays with redundant rows and columns used to replace rows and columns having defective cells. Peripheral circuitry, including wordline decoders, column decoders, virtual-ground decoders, wordline drivers, and column/segment pass gates, all of which function to connecting reading and programming voltages to the rows and columns of cells in response to address inputs routed through a predecoder and program path. Data are written into the memory arrays during programming operations. During reading operations, data from the memory arrays are routed through sense amplifiers to the output.

Figure 2:
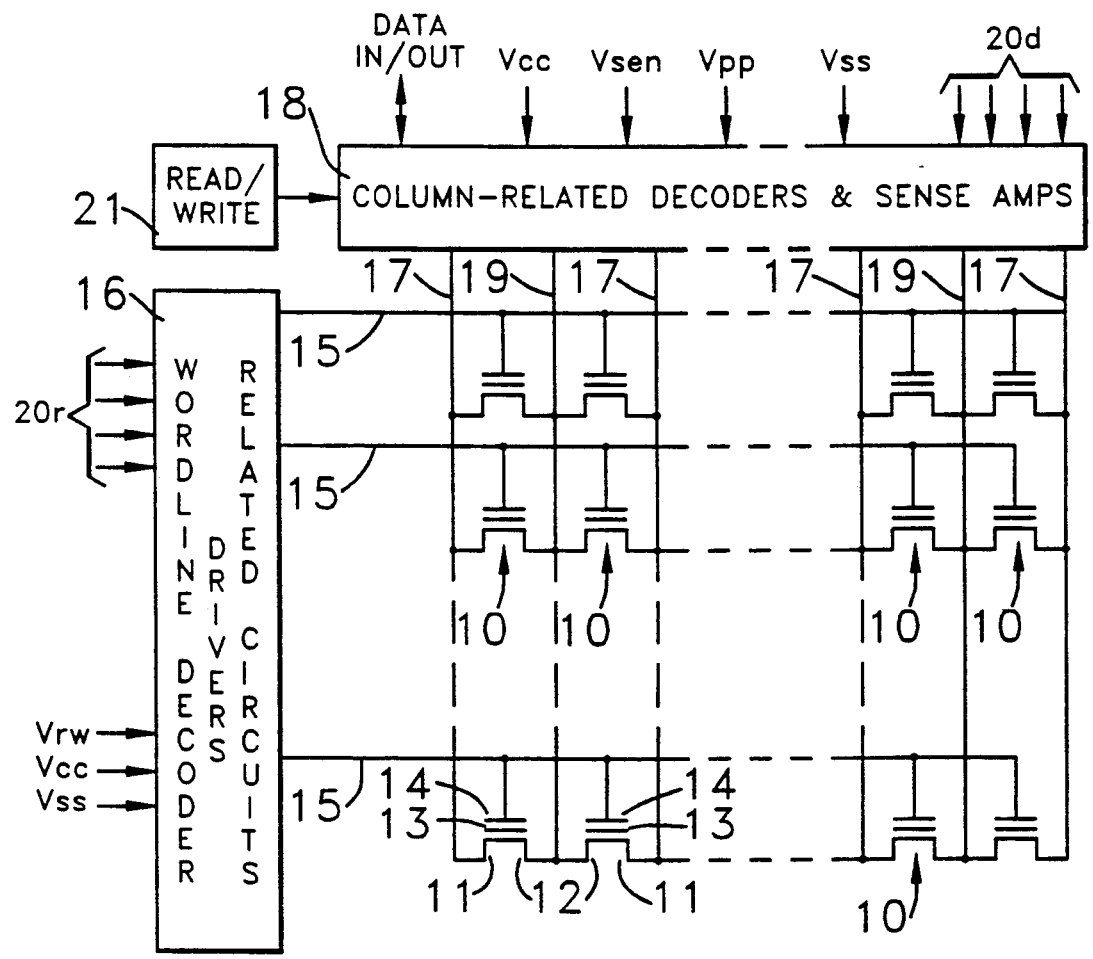
FIG. 2 is a representation of a part of a memory cell array and associated circuitry of the integrated circuit of FIG. 1.

Referring to FIG. 2, an example array of memory cells, which is a part of a memory chip such as that illustrated in FIG. 1, is shown. Each cell is a floating-gate transistor 10 having a source 11, a drain 12, a floating gate 13 and a control gate 14. Each of the control gates 14 in a row of cells 10 is connected to a wordline 15 (or row line 15), and each of the wordlines 15 is connected to a wordline circuit 16, which includes wordline decoders, drivers and related circuitry. Each of the sources 11 in a column of cells 10 is connected to a source-column line 17 (which may be a virtual-ground line), and each of the source-column lines 17 is connected to a column circuit 18, which includes column-/segment decoders, virtual ground decoders and column/segment pass gates. Each of the drains 12 in a column of cells 10 is connected to a drain-column line 19, and each of the drain-column lines 19 is connected to the column circuit 18.

In a write or program mode, the wordline circuit 16 may function, in response to wordline address signals on lines 20r and to signals from Read/Write control circuit 21, (or a microprocessor 21) to place a preselected first programming voltage Vpp (approx. +12.5V) on a selected wordline 15, including a selected control-gate conductor 14. Column circuit 18 also functions to place a second programming voltage Vrw (Vpp reduced through an impedance to approx. +5 to +10V) on a selected source-column line 17 and, therefore, the source 11 of selected cell 10. The selected drain-column line 19 is connected to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately $-2V$ to $-6V$ with respect to the channel region. The injected electrons and negative voltage in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, the wordline circuit 16 functions, in response to wordline address signals on lines 20r and to a signal from Read/Write control circuit 21, to apply a preselected positive voltage Vcc (approx. +3 to +5V) to the selected wordline 15 (and the selected control gate 14), and to apply a low voltage (ground or Vss) to deselected wordlines 15. The column circuit 18 functions, in response to column address signals on lines 20d, causes a sense amplifier to apply a preselected positive voltage Vsen (approx. +1 to +1.5V) to the selected drain-column line 19. The column circuit 18 also functions to connect all of the source-column lines 17 to ground (or Vss) except for the source-column line 17 sharing the same drain-column line connected to the cell 10 that is being read. That source-column line 17 is driven to the same voltage level as the selected drain-column line. The conductive or nonconductive state of the cell 10 connected to the selected drain-column line 19 and the selected wordline 15 is detected by a sense amplifier connected to the DATA OUT terminal.

As is well-known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable.

Figure 3:
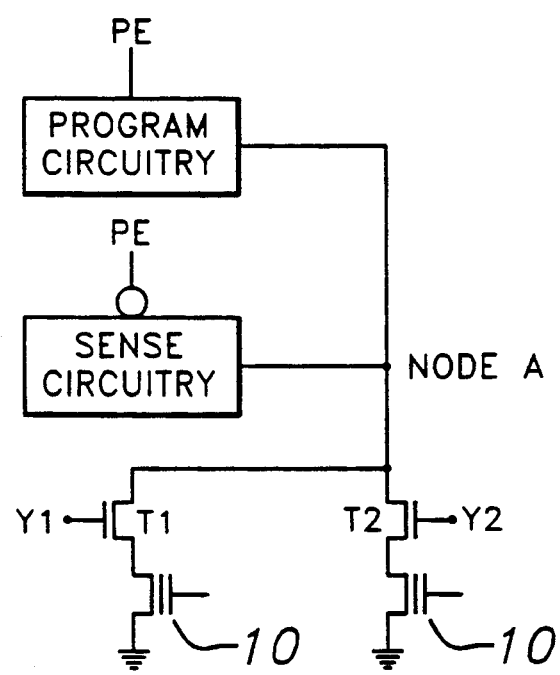
FIG. 3 is a schematic representation of prior-connection circuitry.

Referring to FIG. 3, an example of prior-art circuitry is illustrated. Transistors T1 and T2 select which column of cells 10 to either program or read in response to decoder signals Y1 and Y2. The program enable input signal PE determines which block of circuitry, Program or Read, is activated. The function of the node A that joins the two circuitry blocks is limited to two functions. Those two functions are to either connect the Read circuitry to a column of cells 10 or to force programming potentials onto the column of cells 10. For standard EPROMs, a high voltage is applied to the drain-column lines 19 of the virtual-ground-type EPROMs, the programming potential is reference potential Vss, if a high voltage is applied to the other diffusion of the memory cell. Flash EEPROMs may use the same programming voltages or may use a programming voltages having values of erase and/or programming potentials other than a high voltage or reference potential Vss.

Figure 4:
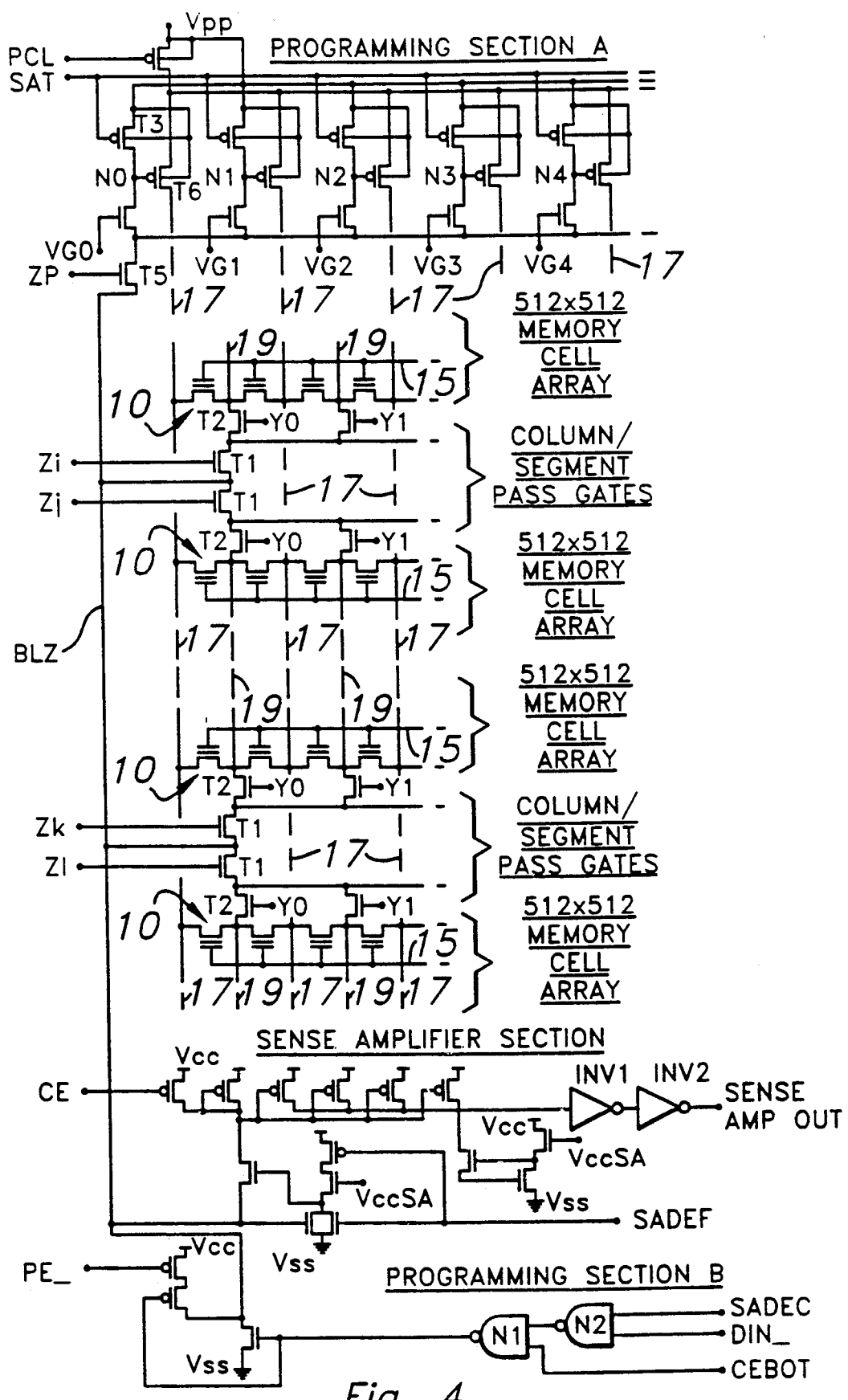
FIG. 4 is a schematic representation illustrating the connection of this invention.

Referring now to FIG. 4, the node A of FIG. 3 is expanded to provide a path for logic signals between separated programming circuitry, as a path for programming, as a path for reading operation bias voltages and as a path for data of read signals. In FIG. 4, common signal line BLZ corresponds to Node A of FIG. 3. Common signal line BLZ serves as a logic signal path between PROGRAMMING SECTION A and PROGRAMMING SECTION B during program operation, serves as a path for Vss programming voltages during program operation, serves as a path for applying bias voltage Vsen from the SENSE AMPLIFIER SECTION during read operation, and serves as a path for data to reach the SENSE AMPLIFIER SECTION from the 512×512 MEMORY CELL ARRAYs during read operation.

In the example implementation circuit of FIG. 4, the PROGRAMMING SECTION A circuitry, as in the example of FIG. 1, is located at the top of the chip. The SENSE AMPLIFIER circuitry and the PROGRAMMING SECTION B circuitry, also as in the FIG. 1 example, are located at the bottom of the chip. And, as in the FIG. 1 example, the 512×512 MEMORY CELL ARRAYs are distributed throughout the memory chip. Not shown are transistors connecting individual continuous source-column lines 17 to reference potential Vss in response to decoded signals. Also not shown are transistors connecting those same continuous lines 17 to a bias generator in response to other decoded signals.

During the read mode of operation, the PROGRAMMING SECTION A circuitry and the PROGRAMMING SECTION B circuitry are inactivated by the Z-decode signal ZP, the VGP (VGO et seq.), the DIN_, and the PE_ signals. During the programming mode of operation, the SENSE AMPLIFIER SECTION is turned off by the sense-amplifier-defeat signal SADEF while the PROGRAMMING SECTION A and the PROGRAMMING SECTION B circuits are activated.

Referring to the PROGRAMMING SECTION A circuitry, the PCL signal limits programming currents to an acceptable level. The SAT signal controls the resistance of the P-channel load devices T3 such that those devices operate at low current. The Z-decode signal ZP and the virtual-ground signals VGP (VG0, VG1 et seq.) are decoding signals active only in the programming mode.

Referring to the PROGRAMMING SECTION B circuitry, the inverse program enable signal PE_ is low during the programming mode of operation, the chip-enable-bottom signal CEBOT is high when the chip is active, the sense-amplifier-decode signal SADEC is a decoded signal, and the low-data-in signal DIN_ is high when programming a data "zero", low when programming a data "one".

During the programming mode of operation, line BLZ is driven to supply voltage Vcc in response to the low-data-in signal DIN_ going low (a data "one" is programmed). As an example, if the left source-column line 17 is selected for programming (meaning VG0=ZP=Vcc), node N0 is pulled to programming voltage Vpp by transistor T3. This occurs because both transistor T4 and transistor T5 are nonconductive because the gates of those transistors are at potential Vcc and the sources of those transistors are at a potential no lower than Vcc. If line BLZ is driven to ground in response to low-data-in signal DIN_ going high (a data "zero" is programmed), then node N0 is pulled low because transistor T3 is placed in a resistive state via the PROSAT signal. When node N0 is low, transistor T6 supplies programming voltage Vrw to the left source-column line 17. Also when low, the line BL provides the ground path for the selected bit during programming via transistors T1 and T2, which are activated by selected Y and Z signals.

Therefore, during the programming mode of operation the single conductor BLZ is used to transmit "PROGRAM" or "NO PROGRAM" instructions from the PROGRAMMING SECTION B circuitry at the bottom part of the memory circuit of FIG.4 to the PROGRAMMING SECTION A circuitry at the top part of that memory circuit. In addition, the single conductor furnishes ground for the selected 512×512 array segment to be programmed. The multi-conductor bus providing the VG0 et seq. information need only connect to the upper PROGRAMMING SECTION A circuitry and not to the PROGRAMMING SECTION B circuitry or to the individual 512×512 array segments.

It should be noted that when "ones" are programmed, the supply voltage Vcc is introduced into the array because line BLZ is driven to Vcc. However, for most applications, the voltage Vcc is below the level that causes excessive stress.

During the read mode of operation, common signal line BLZ carries data from the array to the SENSE AMPLIFIER, which provides bias voltage to the column being read, which senses whether or not particular cells have been programmed with a data "zero" or a data "one", and which furnishes that data at the SENSE AMP OUT terminal. The sense amplifier circuit shown in FIG. 4 as SENSE AMPLIFIER represents but one example of a sense amplifier that may be used in the memory chip using a common node or line BLZ. In the circuit of FIG. 4, the input terminal VccSA is a reference voltage input.

In summary, the common connection described herein reduces the amount of chip area required to perform read and programming functions, particularly where signals such as read, programming, supply voltage and data signals are generated from remote locations on the memory chip. The common connection is described for an integrated-circuit memory having a control circuit 21, a plurality of MEMORY CELL ARRAYs having column lines 17 and 19, a SENSE AMPLIFIER SECTION circuit, and a programming circuit including a first PROGRAMMING SECTION A part and a second PROGRAMMING SECTION B part. At least one column-line 19 of one memory cell array is selectively connected to a common line/node BLZ upon receiving signals Y0 et seq. and Zi et seq. from the control circuit 21. The PROGRAMMING SECTION A part of the programming circuit is selectively connected to the common line/node BLZ upon receiving signal ZP from the control circuit 21. The PROGRAMMING SECTION B part of the programming circuit is selectively connected to the common line/node BLZ upon receiving signals CEBOT, SADEC and PE_ from the control circuit 21. The SENSE AMPLIFIER SECTION circuit is selectively connected to the common line/node BLZ upon receiving signal SADEF (being low) from the control circuit 21. The common line/node BLZ may be a conductor extending from a first area of the integrated-circuit memory to a second area of the integrated-circuit memory, the first and second areas including, for example, the PROGRAMMING SECTION A and the PROGRAMMING SECTION B parts of the programming circuit respectively located at opposite ends of the integrated-circuit memory. The PROGRAMMING SECTION A part of the programming circuit may provide a high voltage Vrw to a source-column line 17 of the integrated-circuit memory. The PROGRAMMING SECTION B part of the programming circuit may provide a reference potential Vss and a supply voltage Vcc to the common line/node BLZ, depending on whether or not a particular memory cell 10 is to be programmed.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A common connection for an integrated-circuit memory, said memory having a control circuit, at least one memory cell array having column lines, and a programming circuit including at least first and second parts, comprising:

at least one column of said at least one memory array selectively connected to a common conductor upon receiving at least a first signal from said control circuit;

said first part of said programming circuit selectively connected to said common conductor upon receiving at least a second signal from said control circuit; and said second part of said programming circuit connected to said common conductor upon receiving at least a third signal from said control circuit.

2. The common connection of claim 1, wherein said common conductor extends from a first area of said integrated-circuit memory to a second area of said integrated-circuit memory.

3. The common connection of claim 1, wherein said common conductor is a circuit node.

4. The common connection of claim 1, including a sense amplifier circuit, wherein said sense amplifier circuit is selectively connected to said common conductor upon receiving at least a fourth signal from said control circuit.

5. The common connection of claim 1, wherein said first and second parts of said programming circuit are located at opposite ends of said integrated-circuit memory.

6. The common connection of claim 1, wherein said first part of said programming circuit provides a high voltage to a source-column line of said integrated-circuit memory.

7. The common connection of claim 1, wherein said second part of said programming circuit provides a reference potential and a supply voltage to said common conductor.

8. The common connection of claim 1, wherein said integrated-circuit memory is an electrically-programmable read-only memory.

9. The common connection of claim 1, including a plurality of memory cell arrays, wherein said one column of one of said memory cell arrays is selectively connected to said common conductor upon receiving at least a fourth signal from said control circuit.

10. A common connection for an integrated-circuit memory, said memory having a control circuit, a plurality of memory cell arrays having column lines, a sense amplifier circuit, and a programming circuit including at least first and second parts, comprising:
   at least one column of said at least one memory array selectively connected to a common conductor upon receiving at least a first signal from said control circuit;
   said first part of said programming circuit selectively connected to said common conductor upon receiving at least a second signal from said control circuit; and
   said second part of said programming circuit connected to said common conductor upon receiving at least a third signal from said control circuit;
   wherein said common conductor extends from a first area of said integrated-circuit memory to a second area of said integrated-circuit memory;
   wherein said sense amplifier circuit is selectively connected to said common conductor upon receiving at least a fourth signal from said control circuit;
   wherein said first and second parts of said programming circuit are located at opposite ends of said integrated-circuit memory;
   wherein said first part of said programming circuit provides a high voltage to a source-column line of said integrated-circuit memory;
   wherein said second part of said programming circuit provides a reference potential and a supply voltage to said common conductor;
   wherein said integrated-circuit memory is an electrically programmable read-only memory; and
   wherein said one column of one of said memory cell arrays is selectively connected to said common conductor upon receiving at least a fifth signal from said control circuit.

11. An integrated-circuit memory, said memory having a control circuit, at least one memory cell array having column lines, and a programming circuit including at least first and second parts, comprising:
   at least one column of said at least one memory array selectively connected to a common conductor upon receiving at least a first signal from said control circuit;
   said first part of said programming circuit selectively connected to said common conductor upon receiving at least a second signal from said control circuit; and
   said second part of said programming circuit connected to said common conductor upon receiving at least a third signal from said control circuit.

12. The memory of claim 11, wherein said common conductor extends from a first area of said memory to a second area of said memory.

13. The memory of claim 11, wherein said common conductor is a circuit node.

14. The memory of claim 11, including a sense amplifier circuit, wherein said sense amplifier circuit is selectively connected to said common conductor upon receiving at least a fourth signal from said control circuit.

15. The memory of claim 11, wherein said first and second parts of said programming circuit are located at opposite ends of said memory.

16. The memory of claim 11, wherein said first part of said programming circuit provides a high voltage to a source-column line of said memory.

17. The memory of claim 11, wherein said second part of said programming circuit provides a reference potential and a supply voltage to said common conductor.

18. The memory of claim 11, wherein said memory is an electrically-programmable read-only memory.

19. The memory of claim 11, including a plurality of memory cell arrays, wherein said one column of one of said memory cell arrays is selectively connected to said common conductor upon receiving at least a fourth signal from said control circuit.

* * * * *